(12) United States Patent
Takasawa et al.

(10) Patent No.: US 8,373,832 B2
(45) Date of Patent: Feb. 12, 2013

(54) WIRING LAYER, SEMICONDUCTOR DEVICE, AND LIQUID CRYSTAL DISPLAY DEVICE USING SEMICONDUCTOR DEVICE

(75) Inventors: Satoru Takasawa, Sammu (JP); Masanori Shirai, Sammu (JP); Satoru Ishibashi, Sammu (JP)

(73) Assignee: Ulvac, Inc., Chigasaki-shi (JP)

( * ) Notice: Subject to any disclaimer, the term of this patent is extended or adjusted under 35 U.S.C. 154(b) by 0 days.

(21) Appl. No.: 13/503,699

(22) PCT Filed: Oct. 21, 2010

(86) PCT No.: PCT/JP2010/068576
§ 371 (c)(1),
(2), (4) Date: Jul. 3, 2012

(87) PCT Pub. No.: WO2011/052471
PCT Pub. Date: May 5, 2011

(65) Prior Publication Data
US 2012/0262659 A1    Oct. 18, 2012

(30) Foreign Application Priority Data

Oct. 27, 2009  (JP) .................................. 2009-246939

(51) Int. Cl.
*G02F 1/1343* (2006.01)
(52) U.S. Cl. ...................................... 349/139; 349/142
(58) Field of Classification Search .................. 349/139, 349/147, 148
See application file for complete search history.

(56) References Cited

U.S. PATENT DOCUMENTS

| 6,037,257 | A | 3/2000 | Chiang |
| 6,066,892 | A | 5/2000 | Ding |
| 6,160,315 | A | 12/2000 | Chiang |
| 6,387,805 | B2 | 5/2002 | Ding |
| 7,923,723 | B2 | 4/2011 | Hayashi |
| 2001/0034126 | A1 | 10/2001 | Ding |
| 2007/0020931 | A1 | 1/2007 | Koura |
| 2009/0303406 | A1 | 12/2009 | Takasawa |
| 2011/0281134 | A1 | 11/2011 | Maki |

FOREIGN PATENT DOCUMENTS

| JP | 11-54458 | 2/1999 |
| JP | 2005-166757 A1 | 6/2005 |
| JP | 2007-27259 A1 | 2/2007 |
| JP | 2007-250982 A1 | 9/2007 |
| JP | 2009-99847 A1 | 5/2009 |
| JP | 2010-53445 A1 | 3/2010 |
| WO | WO 2008/081806 A1 | 7/2008 |

OTHER PUBLICATIONS

International Search Report for International Application No. PCT/JP2010/068576 dated Dec. 7, 2010.

*Primary Examiner* — Phu Vu
(74) *Attorney, Agent, or Firm* — Kratz, Quintos & Hanson, LLP

(57) ABSTRACT

An electrode film, which is not peeled off from an oxide thin film and in which a copper atom does not diffuse into the oxide thin film, is provided. A wiring layer is composed of a high-adhesion barrier film 37, which is a thin film of Cu—Mg—Al and a copper thin film 38; and the high-adhesion barrier film 37 is brought into contact with the oxide thin film. When a total number of atoms of copper, magnesium, and aluminum is set to 100 at %, if the high-adhesion barrier film 37 contains magnesium in a range of between 0.5 at % and 5 at and aluminum in a range of between 5 at % and 15 at %, then wiring layers 50*a*, 50*b*, can be obtained, whereby the adhesion and the barrier property are compatible with each other, adherence is strong, and a copper atom does not diffuse.

5 Claims, 6 Drawing Sheets

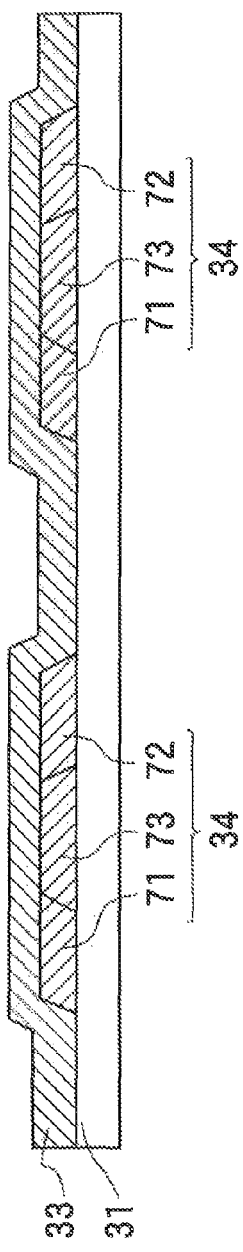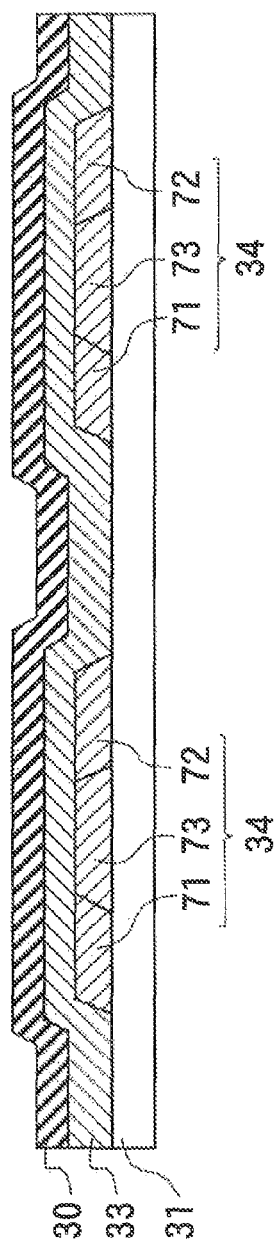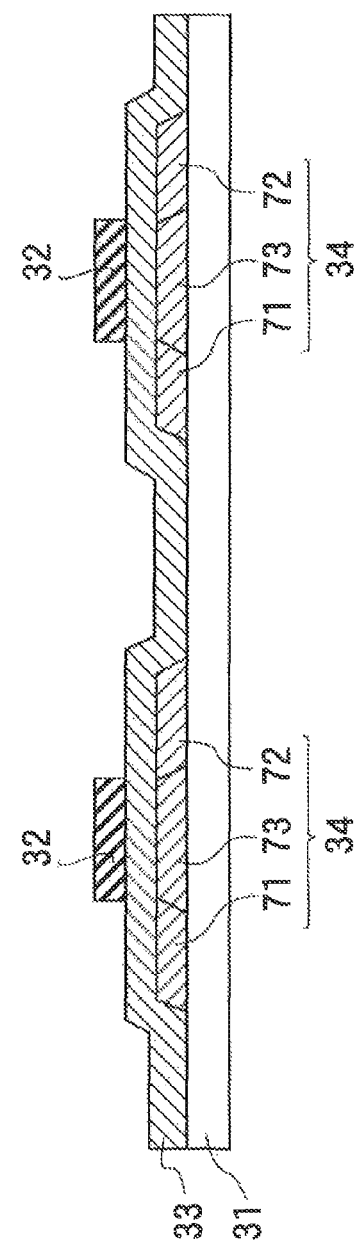
FIG. 1(a)
FIG. 1(b)
FIG. 1(c)

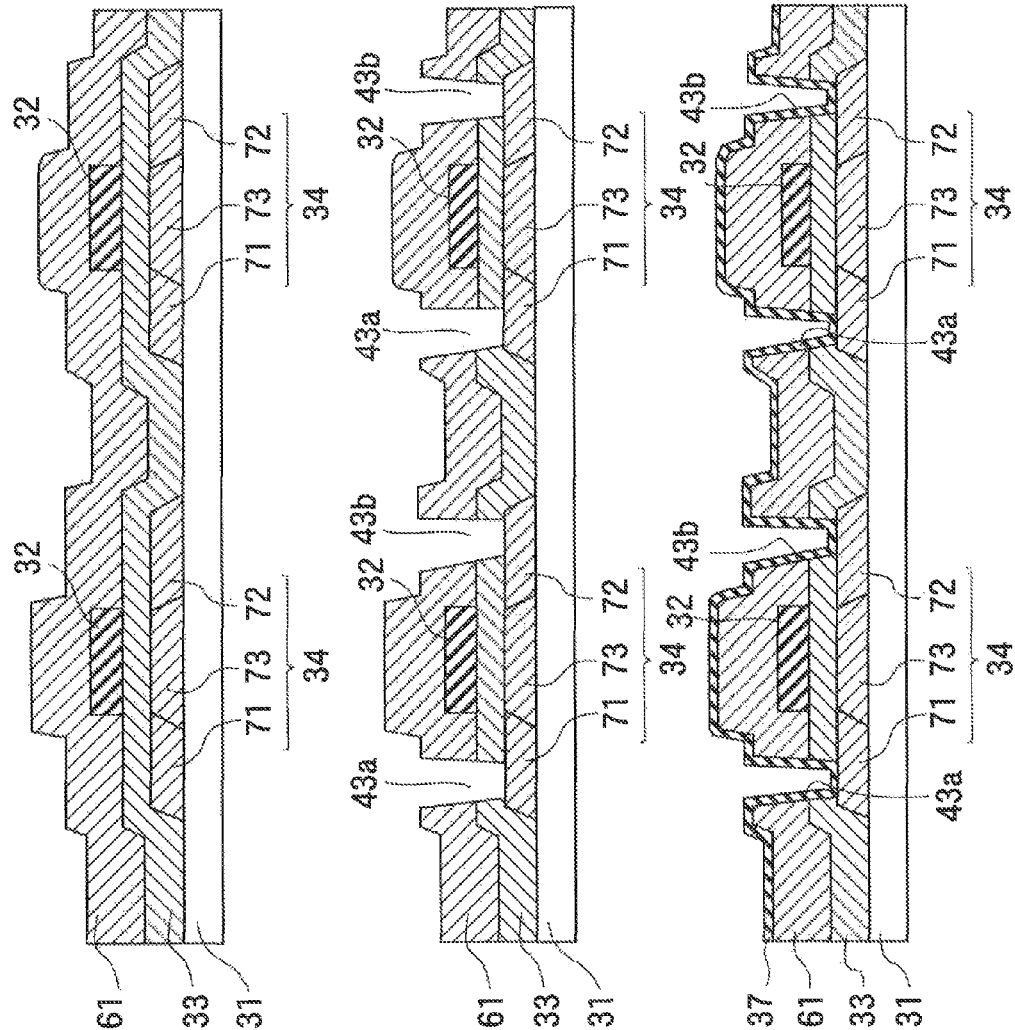

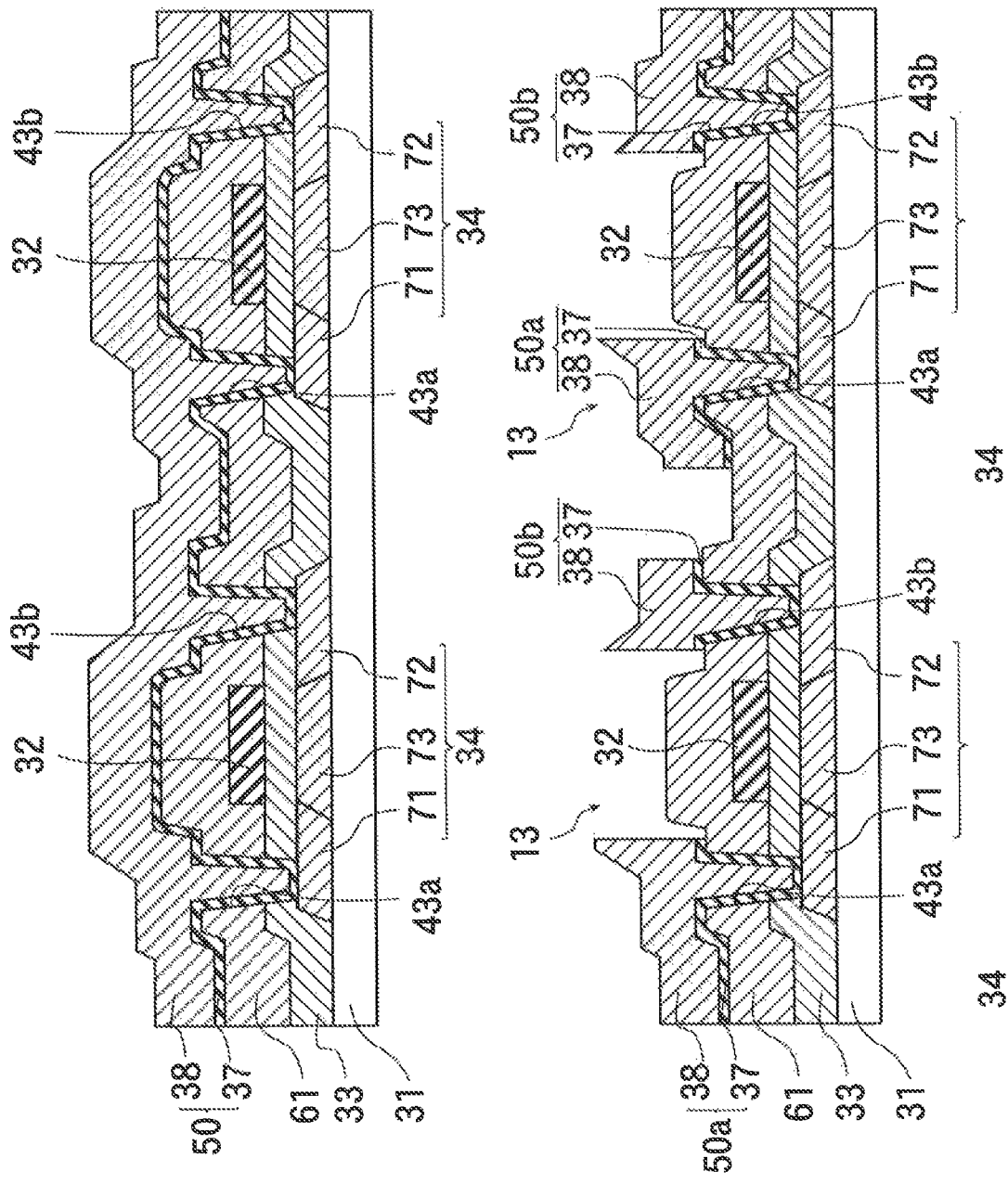

WIRING LAYER, SEMICONDUCTOR DEVICE, AND LIQUID CRYSTAL DISPLAY DEVICE USING SEMICONDUCTOR DEVICE

TECHNICAL FIELD

The present invention generally relates to the field of wiring films used for minute semiconductor devices, and more particularly relates to the technical field of wiring layers contacting an oxide thin film.

BACKGROUND ART

For recently manufactured electric appliances (such as, an FPD (Flat panel display) and a thin-film solar cell), transistors need to be uniformly arranged on a wide substrate; and thus, (hydrogenated) amorphous silicon or the like is used, in which a semiconductor layer having uniform properties can be formed on a large-area substrate.

The amorphous silicon can be formed at low temperature and thus, does not adversely affect other materials. However, the amorphous silicon has a disadvantage of low mobility; and thus, oxide semiconductors, in which a thin film with high mobility can be formed at low temperature on a large-area substrate, attract attention.

On the other hand, in recent years, a low-resistance copper thin film has been used as electrodes and wiring for transistors in a semiconductor integrated circuit or a FPD so as to increase the transmission speed of a digital signal and achieve a reduction in the power consumption due to a reduction in power loss.

However, if the wiring layer in a semiconductor integrated circuit is formed from a copper thin film, there arise disadvantages in that the copper thin film has poor adhesion to an oxide and that the copper atom, which is a constitutive substance of the copper thin film, also easily diffuses into the semiconductor or the oxide.

Accordingly, major problems of the copper wiring on an oxide thin film are peeling and copper diffusion.

As a countermeasure to such problems, a barrier film for improving the barrier properties against diffusion and increasing the adherence strength of the copper thin film can be provided between the copper thin film and the oxide thin film contacting the copper thin film. The examples of the barrier film include a TiN film, a W film or the like.

However, the copper thin film is difficult to be dry-etched; and thus, wet etching is usually used. However, since an etchant for the copper thin film differs from an etchant for the barrier film, a wiring layer with a two-layer structure of the barrier film and the copper thin film needs to be separately etched by changing the etchants, with the use of barrier film in a conventional art.

Therefore, there is a need for a wiring layer which has the barrier properties and the adhesion properties and which can be patterned by one-time etching.

CITATION LIST

Patent Literature

Patent Document 1: Japanese Patent Laid-Open No. 2009-99847
Patent Document 2: Japanese Patent Laid-Open No. 2007-250982

SUMMARY OF THE INVENTION

Problems to be Solved by the Invention

The present invention has been made to solve the above-described inconveniences in the conventional art, and an object of the present invention is to provide a wiring layer which has a strong adherence to an oxide thin film and which does not diffuse a copper atom into the oxide thin film.

Means for Solving the Problems

In order to solve the above-described problems, the present invention is directed to a wiring layer arranged and patterned on an oxide thin film. The wiring layer includes a high-adhesion barrier film in contact with the oxide thin film and a copper thin film arranged on the high-adhesion barrier film, wherein the high-adhesion barrier film contains copper, magnesium, and aluminum, and the high-adhesion barrier film contains magnesium at a content rate in a range of between 0.5 at % and 5 at % and aluminum at a content rate in a range of between 5 at % and 15 at % when a total number of atoms of copper, magnesium, and aluminum is set to 100 at %.

Further, the present invention is directed to a liquid crystal display device including the above-described semiconductor devices, a glass substrate, a pixel electrode layer formed over the glass substrate, a liquid crystal positioned over the pixel electrode layer, and an upper electrode layer positioned over the liquid crystal, wherein either the source electrode layer or the drain electrode layer is connected to the pixel electrode layer by the wiring layer, and a voltage applied between the pixel electrode layer and the upper electrode layer is switched by the semiconductor device, and the liquid crystal is included between the pixel electrode layer and the upper electrode layer.

Further, the present invention is directed to a semiconductor device including the above-described wiring layer, a semiconductor layer, a gate insulating film formed on the semiconductor layer, and a gate electrode film facing the semiconductor layer with the gate insulating film interposed therebetween, wherein, in the semiconductor layer, a channel region is provided in a portion facing the gate electrode film, a source region and a drain region are provided on both sides of the channel region, the gate insulating film is made of the oxide thin film, and the wiring layer is arranged with the high-adhesion barrier film being in contact with the gate insulating film.

Further, the present invention is directed to a semiconductor device including a source electrode layer and a drain electrode layer each made of the above-described wiring layer, a semiconductor layer, a gate insulating film formed on the semiconductor layer, and a gate electrode film facing the semiconductor layer with the gate insulating film interposed therebetween, wherein, in the semiconductor layer, a channel region is provided in a portion facing the gate electrode film, a source region and a drain region are provided on both sides of the channel region, the source electrode layer and the drain electrode layer are in contact with the source region and the drain region, respectively, the oxide thin film is arranged under the source electrode layer and the drain electrode layer, and the wiring layer is arranged with the high-adhesion barrier film being in contact with the oxide thin film.

Further, the present invention is directed to a liquid crystal display device including the above-described semiconductor devices, a glass substrate, a pixel electrode layer formed over the glass substrate, a liquid crystal positioned over the pixel electrode layer, and an upper electrode layer positioned over the liquid crystal, wherein either the source electrode layer or the drain electrode layer is connected to the pixel electrode layer by the wiring layer, a voltage applied between the pixel electrode layer and the upper electrode layer is switched by the semiconductor device, and the liquid crystal is included between the pixel electrode layer and the upper electrode layer.

Effect of the Invention

An oxide thin film is used as an interlayer insulating layer or a gate insulating layer in a semiconductor device or in a liquid crystal display device. Since the wiring layer of the present invention has a strong adherence to the oxide thin film and does not diffuse a copper atom, the wiring layer can be arranged on the interlayer insulating film or on the gate insulating film or inside a connection hole formed therein.

Because the copper thin film and the high-adhesion barrier film can be etched with the same etchant, the wiring layer can be patterned by one-time etching.

BRIEF DESCRIPTION OF THE DRAWINGS

FIGS. 1(a) to 1(c): a process chart (1) illustrating a manufacturing process of a transistor in a first example of the present invention;

FIGS. 2(a) to 2(c): a process chart (2) illustrating the manufacturing process of the transistor in the first example of the present invention;

FIGS. 3(a) and 3(b): a process chart (3) illustrating the manufacturing process of the transistor in the first example of the present invention;

EXPLANATION OF REFERENCE NUMERALS

| 13, 13' | transistor |
| 31 | glass substrate |
| 32 | gate electrode film |
| 33 | gate insulating film |
| 34 | semiconductor layer |
| 37 | high-adhesion barrier film |
| 38 | copper thin film |
| 43 | connection hole |
| 61 | interlayer insulating layer |
| 71 | source region |
| 72 | drain region |
| 73 | channel region |
| 81 | upper electrode layer |
| 82 | pixel electrode layer |
| 83 | liquid crystal |

MODES FOR CARRYING OUT THE INVENTION

<Transistor>

Figure 5:
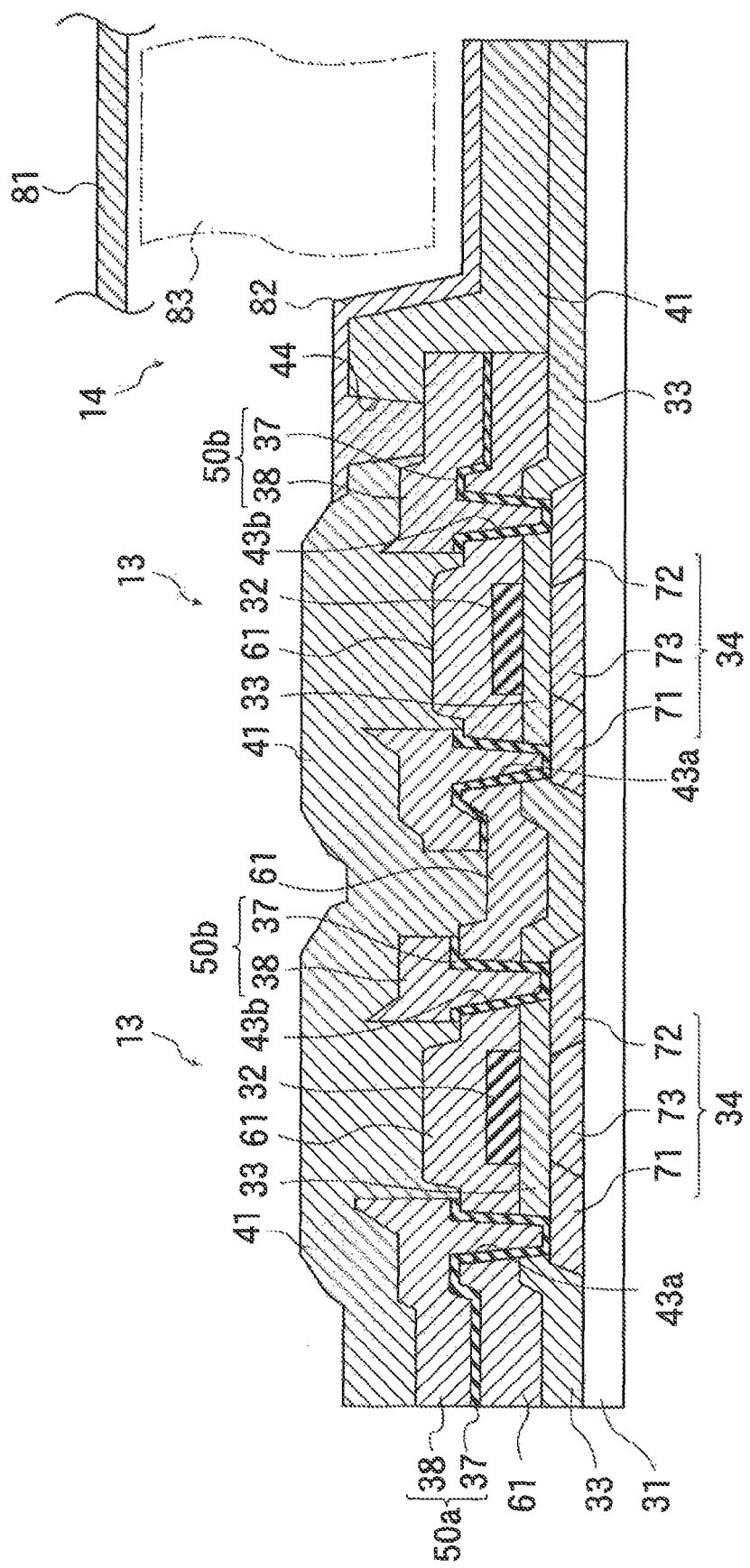
FIG. 5: a figure illustrating the transistor in the first example of the present invention and a liquid crystal display device including the transistor.

FIG. 5 shows a liquid crystal display device of a first example in the present invention; and a cross-sectional view of a transistor 13 of the first example in the present invention is shown together with a liquid crystal display section 14.

Referring to FIG. 5, in the transistor 13, a semiconductor layer 34 is partially formed on a glass substrate 31; and a gate insulating film 33 is formed on the semiconductor layers 34 and on the glass substrate 31 exposed between the semiconductor layers 34. The semiconductor layer 34 includes oxide semiconductors (such as, an IGZO film, an InGaZnO film, a ZnO film, and an $SnO_2$ film), besides single crystal silicon, polysilicon, amorphous silicon, and compound semiconductor.

At both ends of the respective semiconductor layers 34, a source region 71 and a drain region 72 are formed, respectively; and a channel region 73, in which a connection layer is formed, as described later, is arranged between the source region 71 and the drain region 72.

On the semiconductor layer 34, a gate insulating film 33 is arranged over the source region 71, the channel region 73, and the drain region 72.

A gate electrode film 32, at least both ends of which are positioned over the source region 71 and over the drain region 72, respectively, is arranged in a portion over the channel regions 73 of the gate insulating film 33; and on the gate insulating film 33, an interlayer insulating layer 61 which is a thin film made of oxide is arranged so as to cover the gate electrode film 32.

At a position over the source region 71 and at a position over the drain region 72 of a stacked film in which the gate insulating film 33 and the interlayer insulating layer 61 are stacked, connection holes 43a and 43b are formed, respectively, by etching.

A high-adhesion barrier film 37 and a copper thin film 38 are stacked and formed in this order so as to be connected to surfaces of the source region 71 and the drain region 72 exposed to bottom portions of the connection holes 43a and 43b, respectively; and wiring layers 50a and 50b each having a two-layer structure of the high-adhesion barrier film 37 and the copper thin film 38 are formed.

The wiring layers 50a and 50b are drawn around on the interlayer insulating layer 61 at positions not shown.

The wiring layers 50a and 50b are patterned; the wiring layer 50a in which the high-adhesion barrier film 37 is in contact with the surface of the source region 71 is the source electrode layer; the wiring layer 50b in which the high-adhesion barrier film 37 is in contact with the surface of the drain region 72 is the drain electrode layer; the source electrode layer and the drain electrode layer are separated from each other; and thus, the transistor 13 is constituted as described above.

When a gate voltage is applied to the gate electrode film 32 in a state where a voltage is applied to the wiring layer 50a which is the source electrode layer and the wiring layer 50b which is the drain electrode layer, a low-resistance connection layer of the same conductivity type as that of the channel region 73 or a low-resistance connection layer of the conductivity type opposite to that of the channel region 73 is formed in the channel region 73. The source region 71 and the drain region 72 are connected to each other by this connection layer; and the transistor 13 is conducted (ON).

When the application of the gate voltage is stopped, the connection layer connecting the source region 71 and the drain region 72 in a low resistance disappears, and the source electrode layer and the drain electrode layer are cut off (OFF).

The high-adhesion barrier film 37 is a conductive thin film made of Cu—Mg—Al; and the copper thin film 38 is a low-resistance conductive thin film containing copper at a content rate exceeding 50 at % when a total number of atoms is set to 100 at %.

The high-adhesion barrier film 37, when formed on the surface of an oxide thin film (such as $SiO_2$) has a high adhesion to the oxide thin film; and the copper thin film 38 has a high adhesion to the high-adhesion barrier film 37.

The wiring layers 50a and 50b are drawn around on the interlayer insulating layer 61; and the high-adhesion barrier film 37 is in contact with the interlayer insulating layer 61 on the surface of the interlayer insulating layer 61; and thus, the copper thin film 38 is not peeled off from the interlayer insulating layer 61.

Moreover, since the high-adhesion barrier film 37 has a barrier function against a copper atom, a copper atom does not diffuse from the high-adhesion barrier film 37 into the oxide thin film, and furthermore, the high-adhesion barrier film 37 is positioned between the copper thin film 38 and the oxide thin film, such as the interlayer insulating layer 61, the diffusion of a copper atom into the copper thin film 38 is inhibited by the high-adhesion barrier film 37 and the copper diffusion into the oxide thin film is prevented.

Inside the connection holes 43a and 43b formed in the stacked film of the gate insulating film 33 and the interlayer insulating layer 61, side faces formed by etching the gate insulating film 33 and the interlayer insulating layer 61 are exposed to the inner peripheral surfaces of the connection holes 43a and 43b, respectively. The high-adhesion barrier film 37 of the wiring layers 50a and 50b contacts the side faces of the gate insulating film 33 and the interlayer insulating layer 61 which is an oxide thin film, but the copper thin film 38 does not directly contact the side face thereof. Therefore, a copper atom is prevented from diffusing from the side face into the interlayer insulating layer 61 and the gate insulating film 33.

Here, the gate insulating film 33 is an oxide thin film. The high-adhesion barrier film 37 of the wiring layers 50a and 50b contacts the etched side face of the gate insulating film 33, but the copper thin film 38 does not directly contact it. However, the present invention may include the cases where the gate insulating film 33 is not an oxide thin film.

As described above, in the present invention, the copper thin film 38 contacts the surface or the side face of an oxide thin film via the high-adhesion barrier film 37; and thus, the copper thin film 38 is not peeled off from the oxide thin film due to high adhesion of the high-adhesion barrier film 37. In addition, the barrier property of the high-adhesion barrier film 37 prevents the copper atom in the copper thin film 38 and in the high-adhesion barrier film 37 from diffusing into the oxide thin film.

<Liquid Crystal Display Section>

Next, the liquid crystal display section 14 will be explained. In the liquid crystal display section 14, a pixel electrode layer 82 made of a transparent conductive thin film (such as, ITO) is arranged on a protection film 41; and a liquid crystal 83 is arranged over the pixel electrode layer 82. An upper electrode layer 81 is positioned over the liquid crystal 83. When a voltage is applied between the pixel electrode layer 82 and the upper electrode layer 81, the polarization of light passing through the liquid crystal 83 is changed and the transmittance in a polarization filter is controlled.

The pixel electrode layer 82 is electrically connected to the wiring layer 50a as the source electrode layer and to the wiring layer 50b as the drain electrode layer. In FIG. 5, in the protection film 41, a connection hole 44 having the copper thin film 38 of the wiring layer 50b exposed to the bottom surface is formed. The pixel electrode layer 82 is connected to the wiring layer 50b, which is the drain electrode layer of one transistor 13, via the connection hole 44. The application of the voltage to the pixel electrode layer 82 is started or terminated by turning on or off the transistor 13.

<Manufacturing Process>

The manufacturing process of the transistor 13 will hereinafter be explained.

First, as shown in FIG. 1(a), on the surface of the glass substrate 31 in which a plurality of semiconductor layers 34 is formed, the gate insulating film 33 made of an oxide thin film (here, $SiO_2$) is formed to cover the surfaces of the semiconductor layers 34.

Next, as shown in FIG. 1(b), a conductive thin film 30 made of a conductive material for a gate electrode is formed on the surface of the gate insulating film 33. The conductive thin film 30 for the gate electrode is composed of Mo, Ti, W, Ta, or an alloy thereof.

Next, as shown in FIG. 1(c), the gate electrode film 32 made from the remains of the conductive thin film 30 for the gate electrode is formed by patterning the conductive thin film 30 for a gate electrode.

The semiconductor layer 34 includes the source region 71 and the drain region 72 arranged so as to be spaced apart from each other and the channel region 73 sandwiched between the source region 71 and the drain region 72. The gate electrode film 32 is arranged above both the source region 71 and the drain region 72, on the surface of the gate insulating film 33 over the channel region 73.

Next, as shown in FIG. 2(a), the interlayer insulating layer 61 of an oxide thin film is deposited, by the CVD method or the like, all over the surface of the substrate 31 having the gate electrode film 32 formed thereon. The interlayer insulating layer 61 here is an $SiO_2$ film, but the present invention also may include other oxide thin films (such as, SiON).

Next, as shown in FIG. 2(b), the connection holes 43a and 43b are formed, by etching, at the position above a part of the source region 71 and at the position above a part of the drain region 72, respectively, in the stacked film of the interlayer insulating layer 61 and the gate insulating film 33.

The surfaces of the source region 71 and the drain region 72 of the semiconductor layer 34 are exposed to the bottom surfaces of the connection holes 43a and 43b, respectively; and the side faces of the gate insulating film 33 and the interlayer insulating layer 61 produced by etching are exposed to the side surfaces of the connection holes 43a and 43b, respectively.

As shown in FIG. 2(c), the glass substrate 31 having the connection holes 43a and 43b in this state is carried in the vacuum chamber of a sputtering apparatus; and the high-adhesion barrier film 37 is formed all over the glass substrate 31 by sputtering a target made of a Cu—Mg—Al alloy. The high-adhesion barrier film 37 is in contact with the surface and the side face of the interlayer insulating layer 61, the side face of the gate insulating film 33, the surface of the source region 71, and the surface of the drain region 72.

Inside the same vacuum chamber, a target of pure copper is also arranged for formation of the copper thin film 38. After the high-adhesion barrier film 37 is formed in a predetermined film thickness, the sputtering of the target made of a Cu—Mg—Al alloy is completed, the target for forming the copper thin film 38 is sputtered, as shown in FIG. 3(a), the copper thin film 38 is formed all over the surface of the high-adhesion barrier film 37, and the wiring layer 50 consisting of the high-adhesion barrier film 37 and the copper thin film 38 on the surface thereof is obtained. The target for copper thin film contains copper at the content rate exceeding 50 at %.

The copper thin film 38 is fixed to the surface and the side face of the interlayer insulating layer 61, the side face of the gate insulating film 33, the surface of the source region 71, and the surface of the drain region 72 via the high-adhesion barrier film 37.

The wiring layer 50 is etched by using a resist film; and, as shown in FIG. 3(b), from the wiring layer 50 formed all over the glass substrate 31, the wiring layer 50a which is the source electrode layer connected to the source region 71 and the wiring layer 50b which is the drain electrode layer connected to the drain region 72 are formed. The high-adhesion barrier film 37 and the copper thin film 38 are etched by the same etchant.

Figure 4:
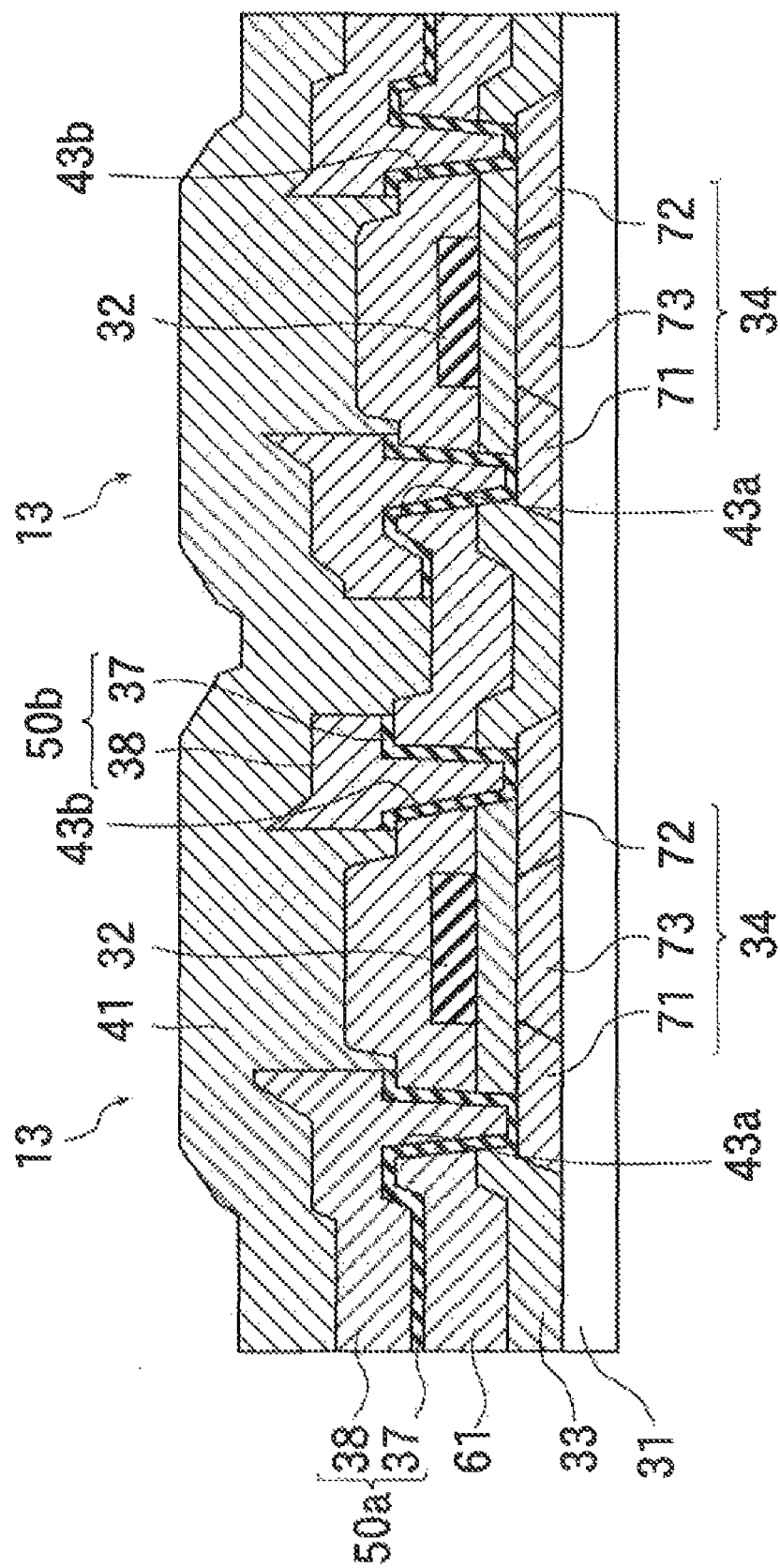
FIG. 4: a process chart (4) illustrating the manufacturing process of the transistor in the first example of the present invention.

Next, as shown in FIG. 4, the protection film 41 is formed on the surfaces of the wiring layers 50a and 50b and on the surface of the interlayer insulating layer 61 or the like exposed between the wiring layers 50a and 50b. Then, as shown in FIG. 5, after the connection hole 44 is formed at the portion of the protection film 41 on the wiring layer 50a or 50b, the pixel electrode layer 82 is formed in a desirable pattern, and the pixel electrode layer 82 is brought into contact with the wiring layer 50a or 50b to be electrically connected to the wiring layer 50a or 50b, thereby constituting a rear panel. This rear panel is bonded together with a front panel having the upper electrode layer 81; the liquid crystal 83 is encapsulated therebetween; and thus, the polarization of light entering the liquid crystal 83 from the glass substrate 31 side of the rear panel and transmitting therethrough can be controlled.

Figure 6:
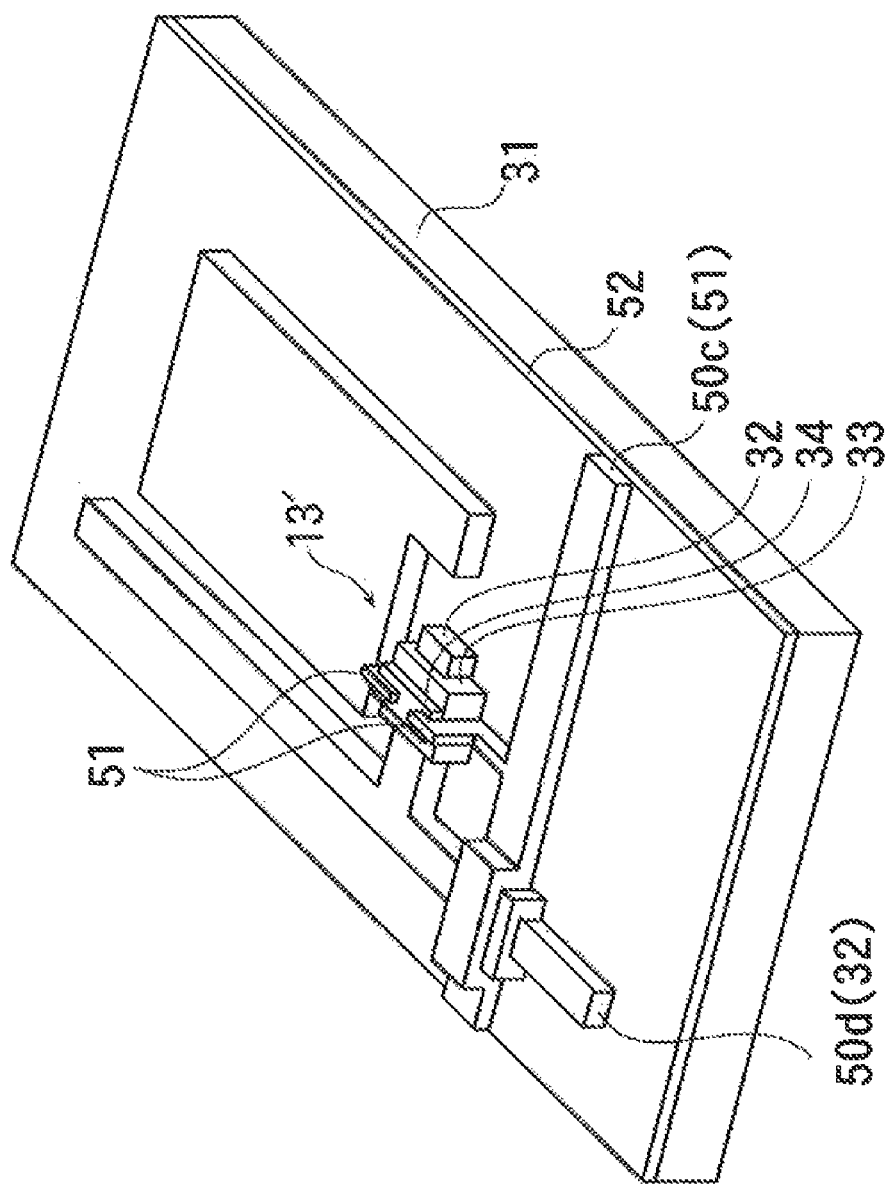
FIG. 6: a schematic perspective view illustrating another example of the wiring layer in the present invention.

In FIG. 6, an oxide thin film 52 is formed on the glass substrate 31, and, in a transistor 13' of FIG. 6, a wiring layer 50c connected to an electrode layer 51, such as the source electrode layer or the drain electrode layer, and a wiring layer 50d connected to the gate electrode film 32 are formed by patterning a metal film. These wiring layers 50c and 50d are used for connection between elements (such as, the connection between the transistors 13' and the connection between the transistor 13' and a capacitance element).

As a specific example, the wiring layer 50c exemplifies a data line and the wiring layer 50d exemplifies an address line.

The wiring layer 50c may be formed together with the source electrode layer or the drain electrode layer. Moreover, the wiring layer 50d may be formed together with the gate electrode layer 32.

Each of the wiring layer 50c and the wiring layer 50d comprises a high-adhesion barrier film in contact with the oxide thin film 52 and a copper thin film stacked on the high-adhesion barrier film. The high-adhesion barrier film and the copper thin film are etched and patterned all together by the same etchant.

The oxide thin film 52 which the high-adhesion barrier 15, film contacts is not limited to the gate insulating film 33 and the interlayer insulating layer, but widely includes thin films made of an oxide. Because the high-adhesion barrier film is in contact with the oxide thin film 52, the wiring layers 50c and 50d are not peeled off and copper does not diffuse from the wiring layers 50c and 50d into the oxide thin film 52.

The transistor 13' of FIG. 6 indicates a bottom gate type transistor, but not limited to this type. The present invention includes any wiring layer having a copper thin film formed in an oxide thin film via a high-adhesion barrier film.

EXAMPLES

A target containing Cu (copper) as the principal component and Mg (magnesium) and Al (aluminum) at a desired proportion was produced; a high-adhesion barrier film made of Cu—Mg—Al, which was the same composition as that of the target, was formed on the surface of an oxide thin film (an $SiO_2$ thin film, here) by sputtering this target; a pure copper thin film was formed on the formed high-adhesion barrier film; and the wiring layer comprising the high-adhesion barrier film and the pure copper thin film was formed.

The adhesion and barrier property of the high-adhesion barrier film having different proportions of Mg and Al to be added were evaluated. The evaluation results are shown in Table 1. The oxide thin film made of $SiO_2$ is formed on the surface of a glass substrate.

TABLE 1

Measurement results of the adhesion and barrier property to insulating thin films made of oxides

| Composition of high-adhesion barrier film | Mg Content X at % | Al Content Y at % | Target manufacturability | Adhesion (Tape test) | | | | Barrier property (AES) | |
|---|---|---|---|---|---|---|---|---|---|
| | | | | $SiH_4$-based $SiO_2$ film | | TEOS-based $SiO_2$ film | | $SiH_4$-based $SiO_2$ film | TEOS-based $SiO_2$ film |
| | | | | Without annealing | After annealing | Without annealing | After annealing | After annealing | After annealing |
| Cu | — | — | o | x | x | x | x | x | x |
| Cu—X at % Mg | 0.5 | — | o | x | x | x | x | x | x |
| | 2.5 | — | o | o | x | o | x | x | x |
| | 5 | — | x | — | — | — | — | — | — |
| Cu—Y at % Al | — | 5 | o | x | x | x | x | x | x |
| | — | 10 | o | o | x | o | x | x | x |
| | — | 15 | o | o | x | o | x | x | x |
| | — | 20 | x | — | — | — | — | — | — |
| Cu—X at % Mg—Y at % Al | 0.5 | 3 | o | x | x | x | x | x | x |
| | | 5 | o | o | o | o | o | o | o |
| | | 10 | o | o | o | o | o | o | o |
| | | 15 | o | o | o | o | o | o | o |
| | | 20 | x | — | — | — | — | — | — |
| | 2.5 | 3 | o | o | x | x | x | x | x |
| | | 5 | o | o | o | o | o | o | o |
| | | 10 | o | o | o | o | o | o | o |
| | | 15 | o | o | o | o | o | o | o |
| | | 20 | x | — | — | — | — | — | — |
| | 5 | 3 | x | — | — | — | — | — | — |
| | | 5 | o | o | o | o | o | o | o |
| | | 10 | o | o | o | o | o | o | o |
| | | 15 | o | o | o | o | o | o | o |
| | | 20 | x | — | — | — | — | — | — |
| | 10 | 3 | x | — | — | — | — | — | — |
| | | 5 | x | — | — | — | — | — | — |
| | | 10 | x | — | — | — | — | — | — |
| | | 15 | x | — | — | — | — | — | — |
| | | 20 | x | — | — | — | — | — | — |

The column "After annealing" indicates the measurement results after heating at 400° C. for an hour in the vacuum atmosphere.

"SiH₄-based SiO₂ film" in Table 1 is an SiO₂ film formed on a glass substrate by the CVD method through the use of an SiH₄ gas and an N₂O gas as the raw material; and "TEOS-system SiO₂ film" is an SiO₂ film formed by the CVD method through the use of TEOS and an O₂ gas.

The numerical values in "Mg content" and "Al content" in Table 1 indicate the contained atomic number proportion of Mg (X at %) and the contained atomic number proportion of Al (Y at %), respectively, when a total number of the numbers of Cu atoms, Mg atoms, and Al atoms in the target or in the high-adhesion barrier film is set to 100 at %, and "-" indicates the case where the content thereof is zero.

The column, "target manufacturability", was marked with "O" when the materials of Cu, Mg, and Al were able to be shaped into the target; and when they were not able to be shaped into the target, the column was marked with "x".

As to the evaluation of the column, "adhesion", an adhesive tape was stuck onto the surface of a pure copper thin film; the adhesive tape was torn off; and this column was marked with "O" when the adhesive tape was peeled off at an interface between the adhesive tape and the pure copper thin film, while when destruction occurs inside the electrode layer or when the adhesive tape was peeled of f at an interface between the electrode layer and the insulating thin film or the semiconductor, this column was marked with "x".

As to the barrier property, the presence or absence of a Cu atom diffused into the oxide thin film (SiO₂ film) in contact with the high-adhesion barrier film was determined by Auger electron spectroscopy; and this column is marked with "O" when Cu is not detected, while when it is detected, this column is marked with "x".

The measurement results shown in Table 1 indicate that, if both Mg and Al are not contained, the adhesion or barrier property especially after annealing are poor and that both the adhesion and the barrier property are excellent when the Mg content is in a range of between 0.5 at % and 5 at % and the Al content is in a range of between 5 at % and 15 at %. Accordingly, the high-adhesion barrier film which is a thin film made of Cu—Mg—Al in the above-described respective examples of the present invention is a conductive thin film having Mg content in a range of between 0.5 at % and 5 at %, and Al content in a range of between 5 at % and 15 at when a total number of the numbers of Cu atoms, Mg atoms, and Al atoms is set to 100 at %.

The copper thin film 38 formed on the high-adhesion barrier film 37 so as to be in contact with the high-adhesion barrier film 37 is a low-resistance conductive thin film containing copper with a content exceeding 50 at when a total number of atoms is set to 100 at %.

As the oxide thin film in the above-described examples, for example, an SiON film, an SiOC film, an SiOF film, an Al₂O₃ film, a Ta₂O₅ film, an HfO₂ film, a ZrO₂ film, or the like can be used.

The invention claimed is:

1. A wiring layer arranged and patterned on an oxide thin film, the wiring layer comprising:
    a high-adhesion barrier film in contact with the oxide thin film; and
    a copper thin film arranged on the high-adhesion barrier film,
    wherein the high-adhesion barrier film contains copper, magnesium, and aluminum, and the high-adhesion barrier film contains magnesium at a content rate in a range of 0.5 at % to 5 at % and aluminum at a content rate in a range of 5 at % to 15 at % when a total number of atoms of copper, magnesium, and aluminum is set to 100 at %.

2. A semiconductor device comprising:
    a wiring layer according to claim 1;
    a semiconductor layer;
    a gate insulating film formed on the semiconductor layer; and
    a gate electrode film facing the semiconductor layer with the gate insulating film interposed therebetween,
    wherein, in the semiconductor layer, a channel region is provided in a portion facing the gate electrode film, a source region and a drain region are provided on both sides of the channel region, the gate insulating film is made of the oxide thin film, and the wiring layer is arranged with the high-adhesion barrier film being in contact with the gate insulating film.

3. A semiconductor device comprising:
    a source electrode layer and a drain electrode layer each made of a wiring layer according to claim 1;
    a semiconductor layer;
    a gate insulating film formed on the semiconductor layer; and
    a gate electrode film facing the semiconductor layer with the gate insulating film interposed therebetween,
    wherein, in the semiconductor layer, a channel region is provided in a portion facing the gate electrode film, a source region and a drain region are provided on both sides of the channel region, the source electrode layer and the drain electrode layer are in contact with the source region and the drain region, respectively, the oxide thin film is arranged under the source electrode layer and the drain electrode layer, and the wiring layer is arranged with the high adhesion barrier film being in contact with the oxide thin film.

4. A liquid crystal display device comprising:
    a semiconductor device according to claim 2;
    a glass substrate;
    a pixel electrode layer formed over the glass substrate;
    a liquid crystal positioned over the pixel electrode layer; and
    an upper electrode layer positioned over the liquid crystal,
    wherein either source electrode layer or a drain electrode layer is connected to the pixel electrode layer by the wiring layer, a voltage applied between the pixel electrode layer and the upper electrode layer is switched by the semiconductor device, and the liquid crystal is included between the pixel electrode layer and the upper electrode layer.

5. A liquid crystal display device comprising:
    a semiconductor device according to claim 3;
    a glass substrate;
    a pixel electrode layer formed over the glass substrate;
    a liquid crystal positioned over the pixel electrode layer; and
    an upper electrode layer positioned over the liquid crystal,
    wherein either source electrode layer or a drain electrode layer is connected to the pixel electrode layer by the wiring layer, a voltage applied between the pixel electrode layer and the upper electrode layer is switched by the semiconductor device, and the liquid crystal is included between the pixel electrode layer and the upper electrode layer.

* * * * *